(12) United States Patent
Radke

(10) Patent No.: US 7,747,903 B2
(45) Date of Patent: Jun. 29, 2010

(54) ERROR CORRECTION FOR MEMORY

(75) Inventor: William Henry Radke, Los Gatos, CA (US)

(73) Assignee: Micron Technology, Inc., Boise, ID (US)

(*) Notice: Subject to any disclaimer, the term of this patent is extended or adjusted under 35 U.S.C. 154(b) by 341 days.

(21) Appl. No.: 11/774,825

(22) Filed: Jul. 9, 2007

(65) Prior Publication Data

US 2009/0019321 A1 Jan. 15, 2009

(51) Int. Cl.
*G06F 11/00* (2006.01)
(52) U.S. Cl. ....................................................... 714/42
(58) Field of Classification Search ................... 714/42
See application file for complete search history.

(56) References Cited

U.S. PATENT DOCUMENTS

| | | |
|---|---|---|
| 4,701,884 A | 10/1987 | Aoki et al. |
| 4,716,566 A | 12/1987 | Masuhara et al. |
| 5,043,940 A | 8/1991 | Harari |
| 5,233,610 A | 8/1993 | Nakayama et al. |
| 5,276,834 A | 1/1994 | Mauritz et al. |
| 5,394,362 A | 2/1995 | Banks |
| 5,450,354 A | 9/1995 | Sawada et al. |
| 5,450,363 A | 9/1995 | Christopherson et al. |
| 5,475,693 A | 12/1995 | Christopherson et al. |
| 5,513,137 A | 4/1996 | Lee et al. |
| 5,513,192 A | 4/1996 | Janku et al. |
| 5,524,096 A | 6/1996 | Roohparvar |
| 5,557,576 A | 9/1996 | Roohparvar et al. |
| 5,559,742 A | 9/1996 | Lee et al. |
| 5,621,682 A | 4/1997 | Tanzawa et al. |
| 5,729,489 A | 3/1998 | Fazio et al. |
| 5,754,567 A | 5/1998 | Norman |
| 5,864,569 A | 1/1999 | Roohparvar |
| 6,601,211 B1 | 7/2003 | Norman |
| 6,741,253 B2 | 5/2004 | Radke et al. |
| 6,784,889 B1 | 8/2004 | Radke |
| 6,956,577 B2 | 10/2005 | Radke et al. |
| 7,023,735 B2* | 4/2006 | Ban et al. ................ 365/185.2 |
| 7,099,221 B2 | 8/2006 | Klein |
| 2002/0048202 A1 | 4/2002 | Higuchi |
| 2005/0172207 A1 | 8/2005 | Radke et al. |
| 2005/0201151 A1* | 9/2005 | Tran et al. .............. 365/185.03 |

(Continued)

FOREIGN PATENT DOCUMENTS

| | | |
|---|---|---|
| WO | WO-2006013529 A1 | 2/2006 |
| WO | WO-2007043042 A2 | 4/2007 |
| WO | WO-2009/009076 A2 | 1/2009 |
| WO | WO-2009009076 A3 | 1/2009 |

OTHER PUBLICATIONS

"International Application Serial No. PCT/US2008/008436 Partial Search Report", 5 pgs.

(Continued)

*Primary Examiner*—Michael C Maskulinski
(74) *Attorney, Agent, or Firm*—Schwegman, Lundberg & Woessner, P.A.

(57) ABSTRACT

Methods and devices operate to apply and provide differing levels of error correction within a multi-level, non-volatile memory. In an example, the differing level of error correction is provided within one page of a row of multi-level cells relative to other pages stored within the same row of multi-level cells.

28 Claims, 5 Drawing Sheets

U.S. PATENT DOCUMENTS

2005/0268203 A1  12/2005  Keays et al.
2008/0086588 A1*  4/2008  Danilak et al. .............. 711/103
2008/0109702 A1*  5/2008  Brandman ................. 714/763
2008/0244370 A1*  10/2008  Lam .......................... 714/803
2009/0168516 A1*  7/2009  Murin et al. ........... 365/185.03

OTHER PUBLICATIONS

Ly, Viet , et al., "Flash Storage Partial p. Caching", U.S. Appl. No. 11/698,456, filed Jan. 26, 2007.

Murray, Michael , "MLC Selected Multi-Program for System Management", U.S. Appl. No. 11/672,076, filed Feb. 7, 2007.

Murray, Michael , et al., "Programming Management Data for Nand Memories", U.S. Appl. No. 11/698,455, filed Jan. 26. 2007.

"International application serial No. PCT/US2008/008436 search report mailed Apr. 6, 2009", 20 pgs.

"International application serial no. PCT/US2008/008436 Written Opinion mailed Apr. 6, 2009", 20 pgs.

"International Application Serial No. PCT/US2008/008436 Partial Search Report", 5 pgs, Mar. 19, 2009.

\* cited by examiner

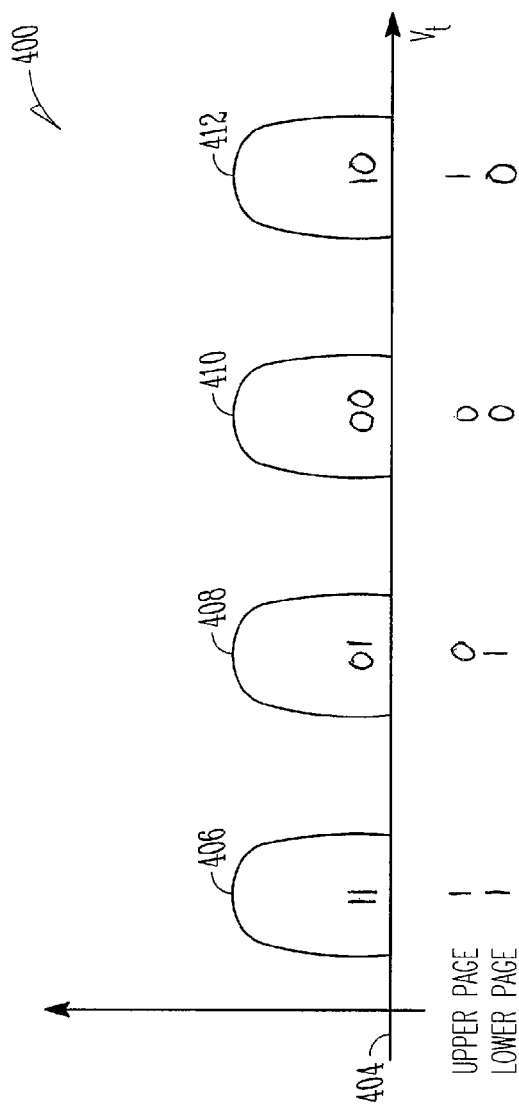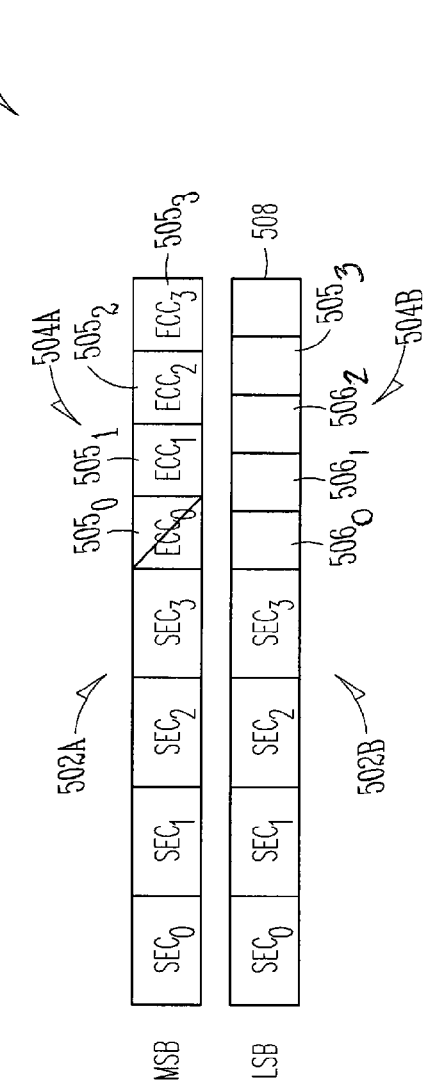

ERROR CORRECTION FOR MEMORY

TECHNICAL FIELD

Embodiments of this disclosure may relate generally to memory devices including non-volatile memory.

BACKGROUND

Memory devices include semiconductor, integrated circuits in computer or other electronic devices. There are many different types that include random-access memory (RAM), read-only memory (ROM), dynamic random access memory (DRAM), synchronous dynamic random access memory (SDRAM), non-volatile memory, and flash memory.

Flash memory devices may utilize one-transistor memory cells which allow for high memory density, high reliability and low power consumption. Flash memory devices are made in two forms: NOR flash and NAND flash. NAND flash can be either of single-level cell (SLC) or multi-level cell (MLC). Memory devices can be categorized further into two broad areas as volatile and non-volatile. Volatile memory devices require power to maintain data, while non volatile memories are capable of maintaining data in the absence of a power supply. An example of a non-volatile memory is a flash memory that stores information on a semiconductor structure without the need for power to maintain the information in the chip. MLC non-volatile memory allows for higher density memory because it allows storage of two or more data bits in each memory cell. Memory devices can be organized into blocks that are divided up into pages, having smaller segments, named sectors. Each sector comprises bits of information, the number of bits is determined by the density of the memory device. Memory devices may further include error correction codes to correct for data errors. Examples of error correction in memory devices can be found in U.S. Patent Application Publication Nos. 2005/0172207 and 2005/0268203, which are assigned to the present assignee and incorporated by reference.

BRIEF DESCRIPTION OF THE DRAWINGS

FIG. 4 is a diagram showing the distribution of threshold voltages of a multi-level cell array of FIG. 3, according to various embodiments of the present invention.

FIG. 5 is a block diagram of example data in a non volatile memory according to various embodiments of the present invention.

DETAILED DESCRIPTION

Some of the disclosed embodiments provide a method for error analysis in memory devices. Error analysis can include detection and analysis, and combinations thereof. Other embodiments provide memory structures, apparatus and/or systems with error correction. In an embodiment, error correction data is stored in a memory area associated with a specific page of data to which the error correction data relate. However, in multilevel cells, which can store more than one data bit, the different bits may not have the have the same likelihood that an error will occur. Thus, the number of cells devoted to error correction data for the more error prone bits can be increased and the number of cells devoted to error correction of the less error prone bits is reduced.

Figure 1:
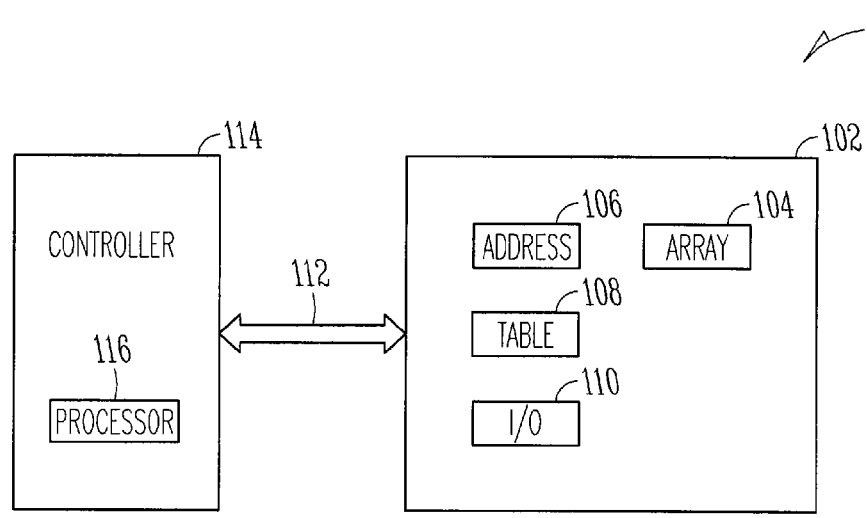
FIG. 1 is a block diagram of a memory system, according to various embodiments of the invention.

FIG. 1 is a simplified block diagram of a memory system 100, according to various embodiments of the present invention. In various embodiments, memory system 100 includes an integrated circuit 102 having an array of non-volatile memory cells 104, address circuitry 106, look up table 108, and input/output (I/O) circuitry 110. Memory cells 104 may be floating gate memory cells. Memory cells 104 may also be referred to as flash memory because blocks of memory cells 104 may be erased concurrently in a flash operation. In an embodiment, the memory cells 104 are multi-level memory cells. Multi-level memory cells store more than one bit of data per cell.

Memory controller 114 includes a processor 116. The processor 116 is connected to control lines 112 that communicate with the memory array 104 via integrated circuit 102. Access to the memory array 104 includes one or more targeted or specified memory cells linked by addressing via the control lines 112. When access to one or more memory cells contained within the memory array 104 is established by the processor 116, data may be written to or read from the memory cells. When an allocation request associated with a read request is sent by the processor 116, such an operation may include accessing multiple rows or pages of data to allow identification of related data contained within the memory array 104.

The look up table 108 can translate logical addresses into physical addresses such that the bad cells or words can be readdressed and the memory array will store a certain quantity of data. In an example, the look up table is in the controller 114.

Figure 2:
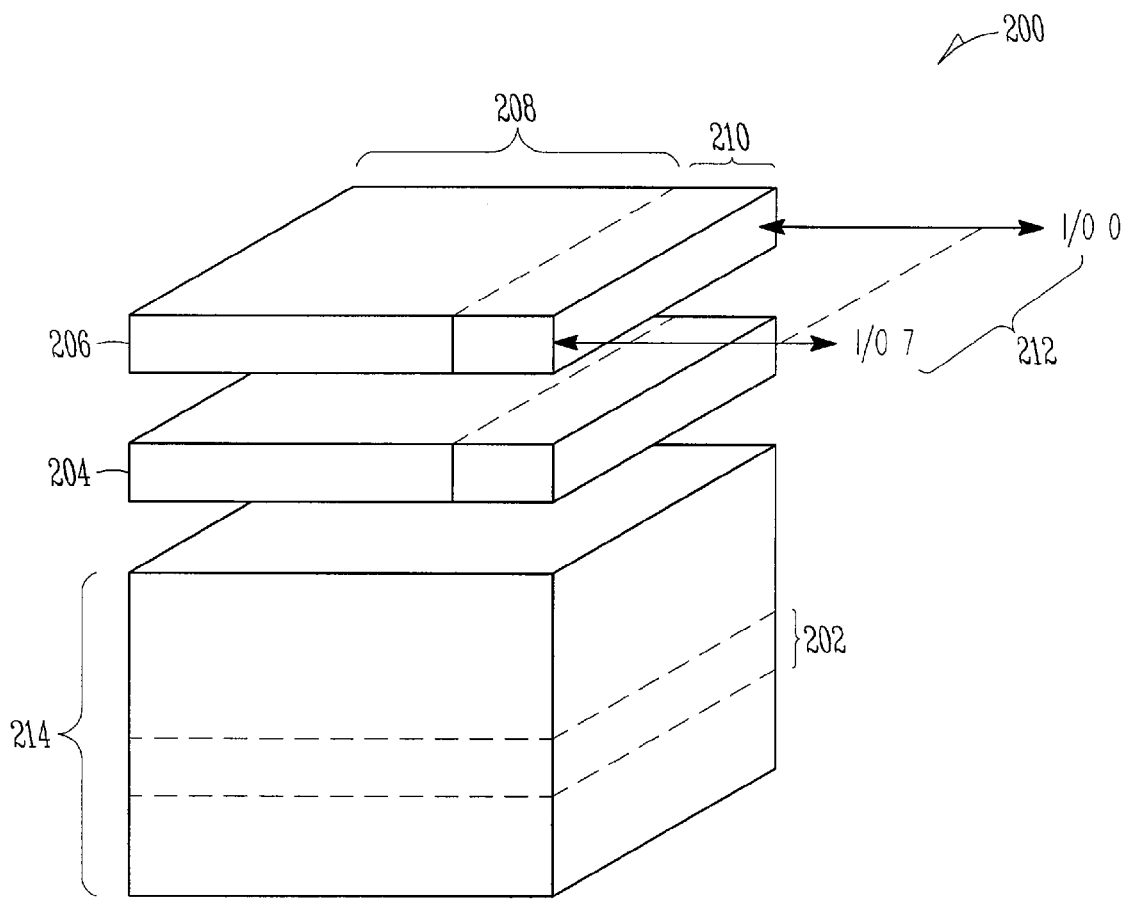
FIG. 2 is a block diagram showing the organization of arrays of memory cells in a NAND flash memory, according to various embodiments of the invention.

FIG. 2 is a schematic diagram showing the organization architecture of arrays of memory cells in a NAND flash memory 200, according to various embodiments of the present invention. Memory 200 is structured to include a plurality of blocks, e.g., block 202, which may be representative of a portion of memory in an array similar to memory array 104. A block is composed of a plurality of pages. The memory 200 further includes a data register 204, a cache register 206, a data area 208, a spare area 210, I/O ports 212 and a plane 214. Data is transferred to and from the NAND flash memory 200, byte-by-byte through the data register 204 and the cache register 206. The cache register 206 can be closest to I/O control circuitry, such as I/O circuitry 110 shown in FIG. 1, and act as a data buffer for the I/O data, whereas the data register 204 can be closest to the memory array, such as memory array 104, and act as a data buffer for the NAND flash memory array operation. In certain examples, NAND flash memory is programmed and read in page-based operations and is erased in block-based operations. In certain examples, during page read and write operations, the data register 204 and cache register 206 are tied together and act as a single register. In certain examples, during cache operations, the data register 204 and cache register 206 operate independently to increase data throughput.

NAND flash memory shown in FIG. 2 includes blocks 202 of pages. Each block 202 is usually composed of 16, 32, or 64 pages. In an embodiment, a NAND Flash block is 128 KB. Erasing a block sets all bits to "1" (and all bytes to FFh). Programming is necessary to change erased bits from "1" to "0." The smallest entity that can be programmed is a page. In various embodiments, each page may comprise 512 bytes (256 words) in data area 208 and an extra 16 bytes (8 words) in spare area 210. In various embodiments, each page may have 2048 bytes (1024 words) in data area 208 and 64 bytes (32 words) in spare area 210. Spare area 210 may store bits used for erase block management functions, marking invalid blocks during the production process, may store logical address information used to reference partial page cache entries associated with multiple full page blocks, or store error correction data. The example of FIG. 2 shows the I/O ports 212 as having a range of bits zero to seven (or 8 bits total) but this may vary as described with respect to page sizes above. In various embodiments, the length of data area 208 and spare area 210 is defined as a "page." The spare area 210 has significantly fewer memory cells than the data area 208. In an example, the spare area 208 has sixty four bytes and the data area has two kilobytes of data area. Stated another way the spare area is about three percent (3.125%) the size of the data area. The data area for each row of memory cells can be divided into four sectors and the spare area includes four separate error correction data segments, one for each data sector. Accordingly, there can be up to 16 bytes in the spare area per 512-byte sector in the data area.

In various embodiments of multilevel cell NAND flash memory, the whole page is programmed at the same time. In an example, a page, that is the first bit of a first page, is programmed in a series of cells. Thereafter a second page, that is the second bit of a second page, is programmed to the same series of cells. As a result, a multilevel cell operation can include two passes to program the multilevel cell. An allocation request associated with a read or write operation to transfer information takes place on a page basis (e.g., 528 bytes at a time, as opposed to a byte or word basis that is performed in a NOR flash.) Additionally, the erase operation takes place on a block basis. In operation, during a page read operation in various embodiments, a page of 528 bytes is transferred from memory into the data register 204. In a page write operation, a page of 528 bytes is written into the data register 204 and then programmed into the memory array 104, such as within the space comprising data area 208. Also, in a block erase operation, a group of consecutive pages is erased in a single operation.

Figure 3:
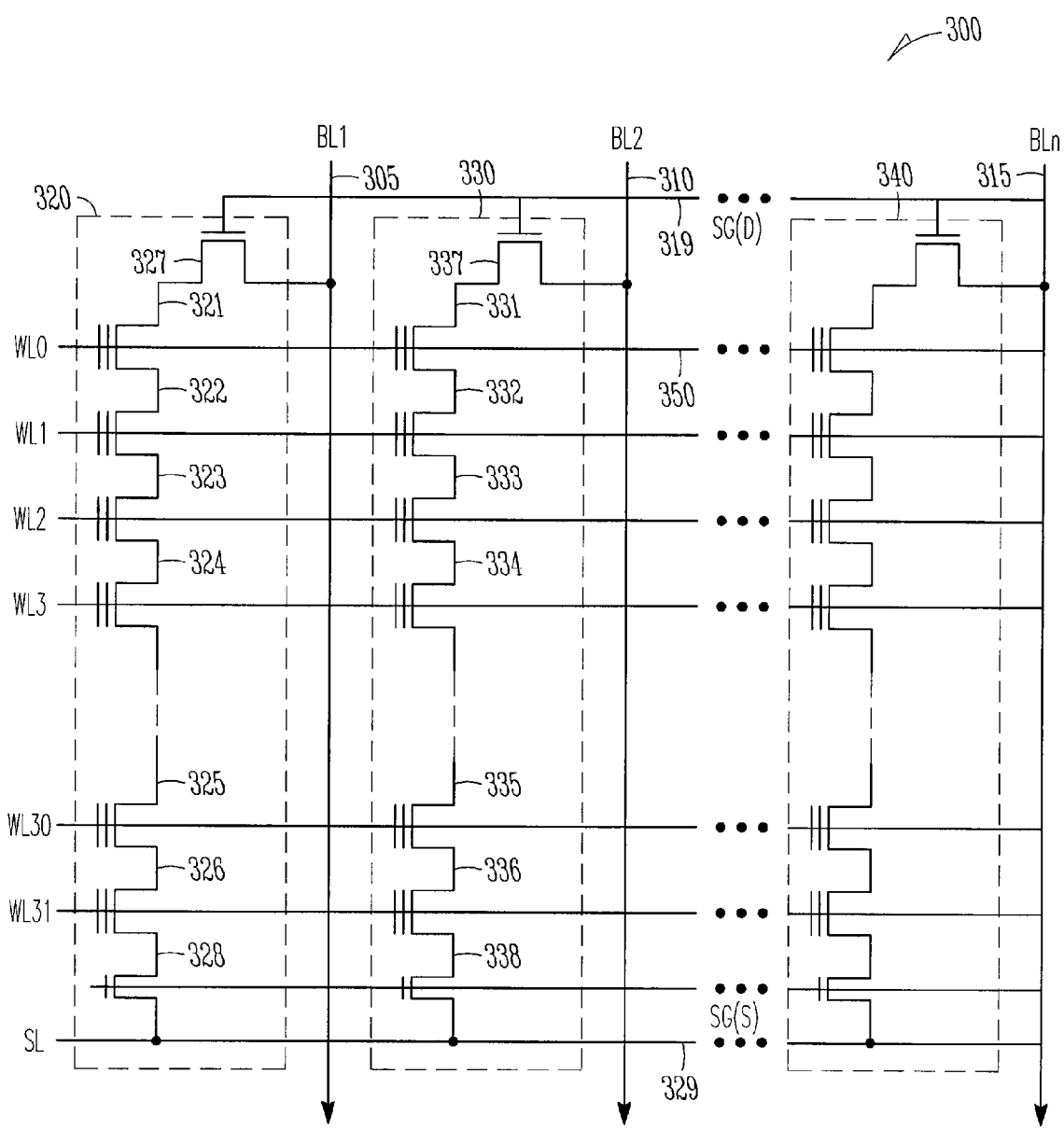
FIG. 3 is a schematic diagram of a NAND flash memory array, according to various embodiments of the present invention.

FIG. 3 is a schematic diagram of a non-volatile flash memory array 300, according to various embodiments of the present invention. An example, of non-volatile memory is NAND flash memory. Memory array 300 shows that the number of bit lines (BL1, BL2-BL$_n$) within a block determines the size of a page. The size of a memory chip is determined by the number of strings allocated to each bit line, i.e., the number of blocks determines the size of a memory chips. The memory array 300 includes an array of floating gate memory cells 321-326 arranged in series string 320. Each floating gate memory cell is to store an energy level that represents more than one bit for a multilevel cell application. Each of the floating gate memory cells 321-326 is connected drain to source, in a series string, such that the drain of the first floating gate memory cell 321 attaches to first bit line BL1 through first drain select gate 327. The state of the first drain select gate 327 is controlled by drain select gate control line SG(D) 319. The arrangement of the series string 320 includes the last floating gate memory cell 326 attached to the first bit line BL1 through first source select gate 328 and controlled by source select gate control line SG(S) 329. A similar arrangement occurs in the second series string 330 and final series string 340 such that the final series string 340 may determine the memory density of the array. As such, similar elements are labeled in a similar manner. The second series string 330 includes an array of floating gate memory cells 331-336, connected drain to source, having the first drain memory cell 331 attached to second bit line BL2 through second drain select gate 337, and is controlled by drain select gate control line SG(D) 319. The last memory cell 336 of the second series string 330 attaches to the second bit line BL2 through second source select gate 338, and is controlled by source select gate control line SG(S) 329.

Word-lines (WL0-WL31) that span across multiple series strings 320, 330 and 340 may be coupled to the control gates of every floating gate memory cell in a given row to control their operation. For example, the first word line WL0 350 couples to each first floating gate memory cell 321, 331 and 341 of bit lines BL1, BL2 and BL$_n$. Each bit line BL1-BL$_n$ eventually couples to sense amplifiers (not shown) that detect the state of each cell. In operation, WL0-WL31 may select the individual floating gate memory cells in the series strings 320, 330 and 340 to be written to or read from and operate the remaining floating gate memory cells in each series string 320, 330 and 340 in a pass-through mode.

Each floating gate memory cell can be programmed using a single bit per cell or multiple bits per cell. Single-level cells (SLC) allow programming a single bit per cell. Multi-level (MLC) allow for programming multiple bits per cell. In an example, one bit is programmed per pass and thus programming multilevel cells can have an equal number of programming passes as the number of bits that can be programmed. Each floating gate memory cell's threshold voltage ($V_t$) determines the data that is stored in the cell. For example, in a single bit per cell architecture, a $V_t$ of 1V might indicate a programmed cell while a $V_t$ of −1V might indicate an erased cell. The multi-level cells have more than two $V_t$ values that each indicates a different state. However, the $V_t$ values are the center of a distribution or range of values that can represent data stored in the multi-level cell. In an example, this distribution may be +/−0.1 V about $V_t$. Multilevel floating gate memory cells take advantage of the analog nature of a traditional flash cell by assigning a bit pattern to a specific voltage range stored on the cell. This technology permits the storage of two or more bits per cell, depending on the number of voltage ranges assigned to the cell. In certain examples, a floating gate memory cell may be assigned four different voltage $V_t$ distributions having a width of approximately 200 milivolts (mV). In various embodiments, a separation of 0.3V to 0.5V is assigned between each $V_t$ distribution as well. This separation zone between the $V_t$ distributions may reduce the chance that the multiple $V_t$ distributions do not overlap, which can lead to logic errors and/or data errors.

Programming of selected floating gate memory cells within a selected WL may be accomplished by sinking the BL to 0V. This results in a potential formed across the channel, and the WL will cause the floating gate memory cell to program. The $V_t$ will increase as higher programming pulses are applied. Between each programming pulse, a verification phase is performed in which the selected WL is lowered to 0V, the unselected WLs are lowered to 5V and the state of the selected WL is detected. If the floating gate memory cell contains a $V_t$ sufficient to prevent conduction of the device with 0V on the WL, it is deemed to be programmed, otherwise it is deemed to be still erased and the programming pulse height is increased by 0.5V and again applied to the selected WL. This process is repeated until all selected WLs are detected as being programmed.

FIG. 4 is a diagram showing the distribution of threshold voltages of a multi-level cell array of FIG. 3, according to various embodiments of the present invention. The X-axis 404 represents threshold voltages ($V_t$) from lowest threshold 406 to intermediate thresholds 408, 410 to highest threshold 412. In certain examples, programming begins with the highest threshold 412 performed first on the associated WL in decreasing order of threshold voltages, as the lowest threshold 406 represents an erased state. The erased state, or lowest threshold 406, indicates a logical "11" since both bits of the multi-layer cell are in a "1" state when erased. It should be noted that, alternatively, some memory devices may indicate an erased state with a logical "0" on each bit. In an example, the highest threshold 412 is the first programmed threshold. This places the highest voltage on the WL prior to all lower multi-level distributions being programmed, which reduces the chance of disturb conditions with other cells on the same WL that are planned to be programmed at lower $V_t$ distributions. In an example, according to one embodiment of the present invention, all the cells in a page that may need to be programmed with bits having the highest threshold 412 are programmed first. The next highest threshold 410 may be programmed next, followed by the next to lowest threshold 408, and then the lowest threshold 406. These programming operations may be accomplished with consecutive programming and verification pulses where two verification pulses with two different levels are applied (i.e., 2V for "01," and 1.3V for "00") between every increasing programming pulse. This procedure may repeat for each data bit within each sector of a page when attempting to fill a data block.

In a further example of a programming operation, the bits in a block are all erased to the lowest state, e.g., state 406 "11" as shown in FIG. 4. Program operations are performed to shift the cells where the most significant bit, i.e., upper page bit, are shifted to zero—states 408 and 410 in FIG. 4. Now the least significant bit, i.e., the lower page bit, can be programmed into the appropriate cells. Here the state changed from lowest state 406 to highest state 412 if the upper page bit remains a "1" or the state changes from state 408 to 410 if the upper page bit is a "0." These programming operations are performed by a series of charge pulses addressed to the appropriate cell, followed by verify operations.

In an example, the data stored in multi-level cells is not read sequentially cell-by-cell. Instead, the cells in a row are read with the digit placement representing a page of data. That is, the most significant bits in the row of cells represent a page of data and the least significant bits in the row of cells represent a different page of data. If the multi-level cells store more than two bits, then the intermediate digit positions would represent their own pages of data. Referring again to FIG. 4, and assuming that sequential cells store the thresholds as shown, then the most significant bit page (upper page) is 0110 and the least significant bit page (lower page) is 0011.

In this example, the most significant bit (upper) page is more likely to have errors than the least significant bit (lower) page. The upper page bit transitions state between thresholds 406 and 408. The upper page bit also transitions state between thresholds 410 and 412. The lower page only transitions state between thresholds 408 and 410. As a result, it is twice as likely to have an error in the upper page. It would be more effective for error correction if an increased quantity of error correction was applied to the more likely error.

FIG. 5 is a block diagram of a data structure 500 that can be stored in a row of a multi-level memory cell memory. In an example, data structure 500 is one row of the data area 208 shown in FIG. 2. Data structure 500 shows a memory storage area 502A, 502B and a spare area 504A, 504B for each of the most significant bit (MSB) page (suffix A) and the least significant bit (LSB) page (suffix B). Memory storage areas 502A and 502B are to store data for an application. The data may be processed or sensed data, such as image sensed data from a processor, e.g., processor 116 of FIG. 1. The storage areas 502A and 502B include a plurality of sectors $SEC_0$, $SEC_1$, $SEC_2$, $SEC_3$, which respectively include a plurality of memory cells to store bits. While shown as four sectors, it will be understood that other even numbers of sectors may be used. The stored energy level in an individual multilevel memory cell represents a most significant bit (MSB) and a least significant bit (LSB). It will be recognized that the present description is extendable to numbers of bits greater than two. However, the present description discusses a two bit multi-level memory for ease of description and understanding. The sectors are consecutive in the memory area. The sectors $SEC_0$, $SEC_1$, $SEC_2$, $SEC_3$ are formed by the same number of cells in each sector. Hence, each sector includes a same number of memory cells and bits for both the most significant bit and least significant bit levels of the data. Typically the sectors are an even division of the number of memory storage cells in a row. An example size of the sectors is 512 kbytes.

The spare areas 504A and 504B are appended to the respective memory storage area 502A and 502B and provide memory storage for so called housekeeping functions associated with the memory. The spare areas 504A and 504B can be positioned at the beginning of a row, i.e., the "0" position or at the end of a row "N" position. Some housekeeping functions include error correction and block management. In an embodiment, the spare areas 504A and 504B are smaller than the data storage areas 502A and 502B. In an embodiment, the spare area 504A corresponding to the upper page is evenly divided into four segments $505_0$, $505_1$, $505_2$, and $505_3$. These segments may each have the same number of bits and in total use all of the available bits in the spare area on the upper page. The MSB page includes error correction data $ECC_0$, $ECC_1$, $ECC_3$, $ECC_4$ that respectively corresponds to sectors $SEC_0$, $SEC_1$, $SEC_2$, $SEC_3$ in the MSB page. The lower (LSB) page as shown includes more than four segments $506_0$, $506_1$, $506_2$, $506_3$, and 508. The LSB page includes error correction data in each of segments $506_0$, $506_1$, $506_2$, $506_3$ that corresponds to a respective sector $SEC_0$, $SEC_1$, $SEC_2$, $SEC_3$ in the LSB page. As shown in FIG. 5, the number of memory cells used for each of the segments 505 of MSB page is larger than the number of memory cells used for each of the segments 506 and 508 of the LSB page. Accordingly, the error correction data segments $505_0$, $505_1$, $505_2$, and $505_3$ include more bits than the error correction code segments $506_0$, $506_1$, $506_2$, $506_3$. This, in some embodiments, is based on a determination that the most significant bit page is more likely to have an error than the least significant bit page. The MSB page includes more bytes for error correction in the error correction data $ECC_0$, $ECC_1$, $ECC_3$, $ECC_4$ than the corresponding error correction data $ECC_0$, $ECC_1$, $ECC_3$, $ECC_4$ for the LSB level.

The spare area 504B for the LSB page further includes block management data segment 508. In contrast, the MSB page error correction uses the entirety of its spare area for only error correction in an embodiment. Segment 508 can store memory management data, such as erase block management data, wear-leveling data, and/or logic-to-physical block mapping data.

In an example, each row of a memory array has 64 bytes in the spare area. For a multi-level memory cells, there is a most significant bit page and a least significant bit page stored within each row of the memory array. For the page that is determined to have the most likely chance at error, its spare area is dedicated entirely to error correction. The spare area corresponding to the other page includes both error correction data and the block management data. In the case where there are 64 bytes in each of the spare area of the row, the data in the spare area can be set as follows. The most error prone page is set to have four sectors. Then this page includes 16 bytes of error correction data for each of the four sectors for a total of 64 bytes. The less error prone page also stores the block management data in its spare area so it can not mirror the layout of the most error prone page. A set number of bytes is dedicated to the block management. The remaining bytes are divided by the number of sectors. In the present case, the block management for both pages can be set at 16 bytes and stored in the spare area of the less error prone page, leaving 48 bytes remaining for error correction for the less error prone page. Thus, each of the four sectors is associated with 12 bytes of error correction data in the spare area. As understood from the present description, by storing block management data in only the less error prone page, additional error correction data can be stored for the more error prone page. This may increase at least one of reliability and error correction of the data stored in the multi-level memory.

The spare area can further be set so that some error correction data, such as check data, for one page is stored in the adjacent page. For example, the less error prone page stores error correction data for both itself and its more error prone companion page. Both pages would be read to acquire the error correction data, such as error correction codes, for the more error prone page. In the example, the more error-prone page includes a 16-bytes per sector of error correction data, such as check data, while the less error-prone page has 12-bytes per sector of error correction data. If analysis of the flash failure mechanisms leads one to believe that that this allocation is not appropriate, for example, some of the 48 bytes on the less error-prone page can be use for more error-prone page error correction data. Each sector on the more error-prone page could, as an example, be assigned an 18-bytes per sector error correction utilizing some of the bytes in the spare area corresponding to the less error-prone page to provide one of the segments, leaving the less error-prone page would then be left with 10-bytes per sector segment for its error correction data.

The error correction data stored in the ECC of the spare area may be coded in accordance with various error correction codes, which can also be referred to as "check bytes". One example is Reed-Solomon code data. Another example is BCH code data. Other types of error correction data include, but are not limited to Hamming code, Reed-Muller code, and forward error correction code.

Figure 6:
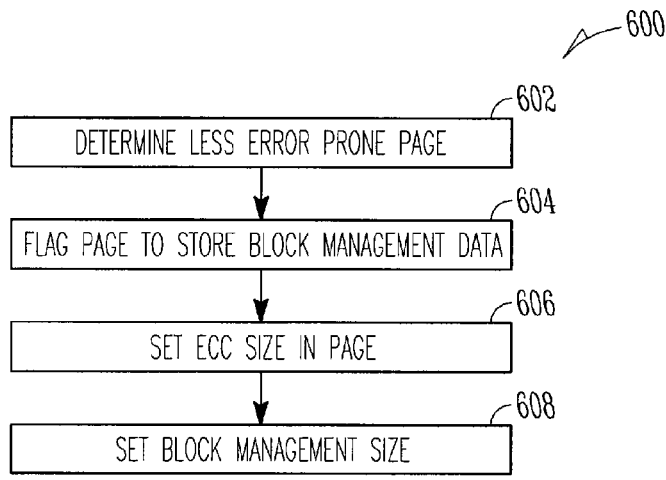
FIG. 6 is a flow chart of a method for determining error correction in non volatile memory according to various embodiments of the invention.

FIG. 6 is a flow chart of a method for setting the error correction arrangement for a non-volatile memory, 600. At 602, a determination is made as to the likelihood of an error occurring in each page of data stored in a single row of multi-level memory cells. This can be based at least partly on the assignment of bit patterns to a respective threshold voltage range. The bit pattern may require that the most significant bit change state more than the least significant bit. One example of this bit pattern is shown in FIG. 4. In another embodiment, the least significant bit may change value more than the most significant bit. Once the less error prone page is determined, then the less error prone page is flagged to store the block management data, 604. At 606, the error correction data size for each page is set. The spare area for the more error prone page can be completely dedicated to error correction data. The spare area of the less error prone page also includes error correction data but has a fewer number of bits allocated for this than the more error prone page. The spare area of the less error prone page reserves a set number of bits, for example, at the end of the spare area, for the block management data, 608. The remaining spare area is then used for error correction of the less error prone page.

Figure 7:
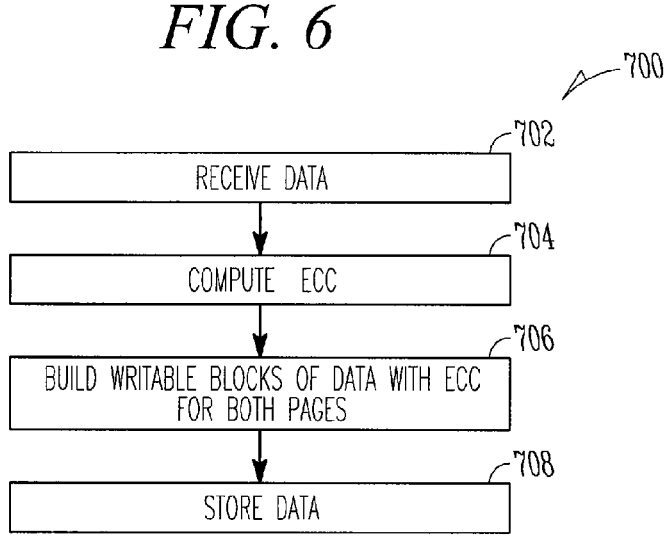
FIG. 7 is a flow chart of a method for storing error correction in non volatile memory according to various embodiments of the invention.

FIG. 7 is a flow chart of a method for programming for a non-volatile memory, 700. The data to be stored is received, 702. During a programming operation, an ECC unit, which can be part of a controller 114 or a processor 116, calculates the ECC data based on the received data to be stored in the sector, 702. Writeable blocks of data including the error correction data are formatted or built, 706. Only error correction data is to be written in the spare area of the more error prone page. Both error correction data and management data are to be written to the spare area of the less error prone page. The ECC data for each data page is then written to the corresponding spare area along with actual data being written to the data area, 708. Examples of building data for writing to a non-volatile memory are described in application Ser. Nos. 11/698,456; 11/698,455; and 11/672,076, each of which is incorporated by reference for any purpose.

Figure 8:
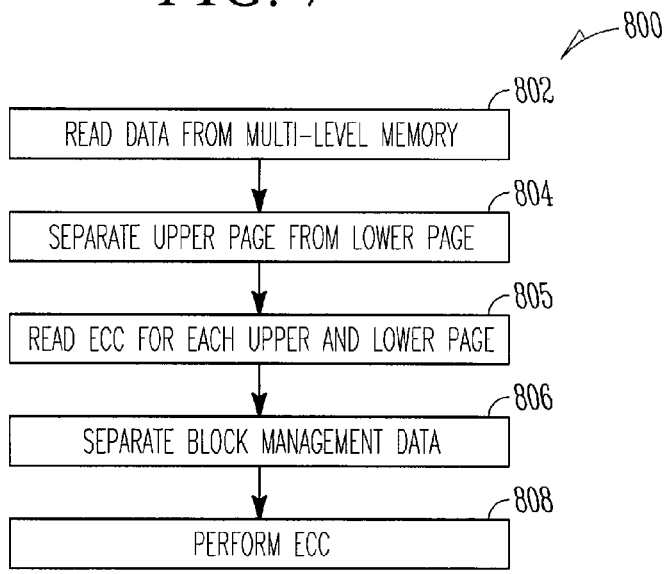
FIG. 8 is a flow chart of a method for reading error correction in non volatile memory according to various embodiments of the invention.

FIG. 8 is a flow chart of a method for reading data from a multi-level memory, 800. At 802, data is read from the multi-level memory. The read data includes both pages of data, error correction data and the block management data stored within the row of multi-level cells. The upper page data and the lower page data are separated, 804. The error correction data is read for each of the lower page and upper page, which data will have a different number of bits for each page. The more error prone page will have a greater number of error correction bits. At 808, the block management data is separated from the error correction data of the less error prone page. When the data is read out, the ECC data is also read out, accordingly, an error correction operation is applied to check that the data is correct, 810. Thus, it is possible for an ECC algorithm to correct data errors and apply different error correction strengths to each page based on the relative error likelihood between the pages. The number of data errors that can be corrected depends on the correction strength of the algorithm used. The ECC algorithm can be implanted in hardware or software. Simple Hamming codes provide the easiest hardware implementation. However, they can correct only single-bit errors. Hamming typically requires 13 bits per sector. Reed-Solomon codes can provide more robust error correction capability. Reed-Solomon require multiples of 18 bits per sector to perform error correction. BCH codes can provide error correction with improved efficiency over Reed-Solomon codes. BCH requires multiples of 13 bits to perform error correction.

Figure 9:
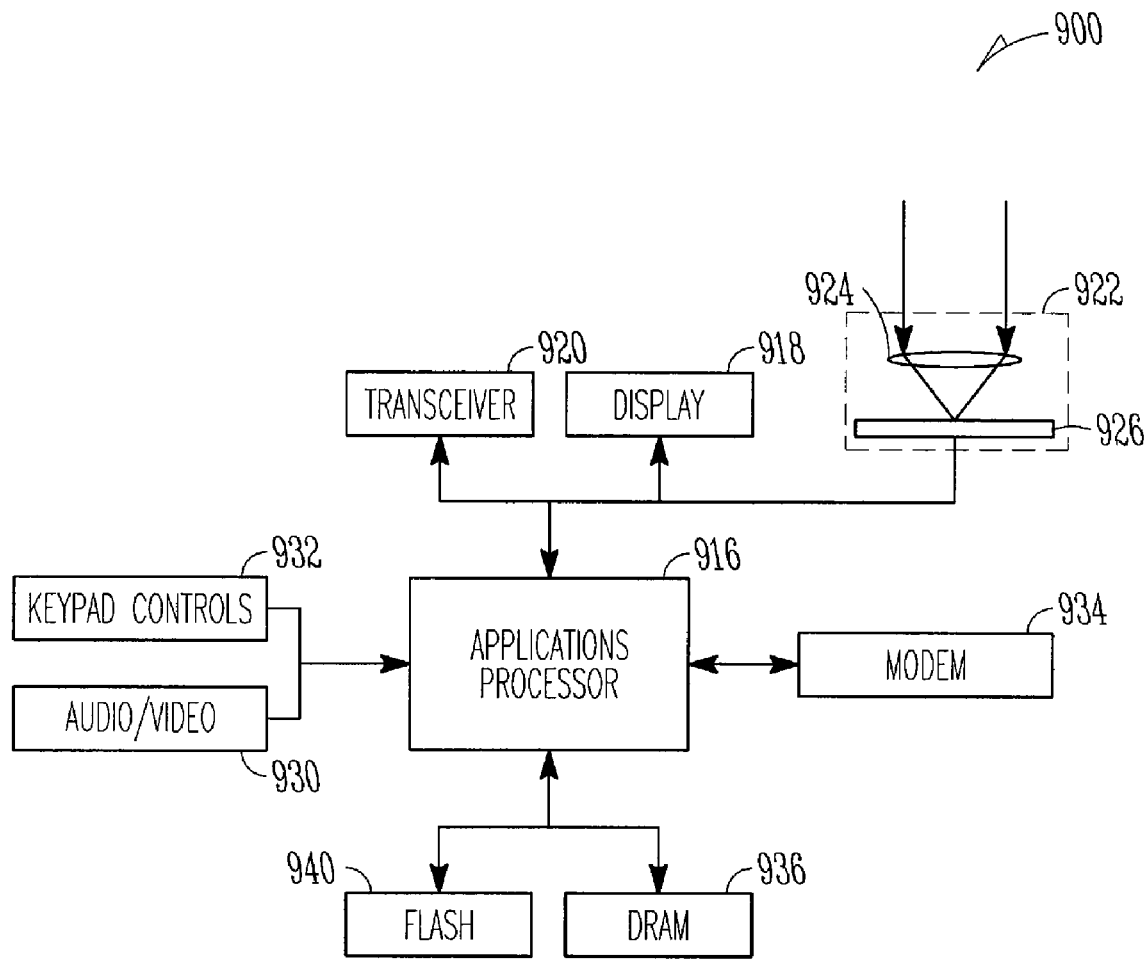
FIG. 9 is a block diagram of a system according to various embodiments of the invention.

FIG. 9 is a block diagram of a system 900 according to various embodiments of the invention. The system 900 includes one or more apparatus, which may be similar to or identical to that of memory system 100 in FIG. 1. The system 900, in some embodiments, includes a processor 916 coupled to a display 918 and/or a wireless transceiver 920. The memory system 100 included in the apparatus 900 and comprising a plurality of memory cells may also be operatively coupled to the processor 916.

In various embodiments, the system 900 includes a camera 922 with including a lens 924 and an imaging plane 926 coupled to the processor 916. The imaging plane 926 receives light rays 928 captured by the lens 924. Many variations of system 900 are possible. For example, in various embodiments, the system 900 includes an audio and or a video media player 930, including a set of media playback controls 932, coupled to the processor 916. In various embodiments, the system 900 includes a modem 934, a DRAM device 936, and a non-volatile flash memory device 940, all coupled to the processor 916.

The size of memory arrays, page blocks, pages and sectors may vary as defined by the memory device. Further, the available bytes in a spare area also vary depending on the particular memory device. Accordingly, the present disclosure is not limited to a specific size of memory unless so claimed.

The present disclosure described structures and methods to compensate for different levels of defect rates in multi-level cell memories. The more error prone or "at-risk" page is subject to a more powerful error correction through the application of a greater amount of error correction data. The block management information is moved to the less error prone page. Thus depending on the comparative error rates between the pages, the error correction codes can be varied to potentially be more effective.

Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments will be apparent to those of skill in the art upon reviewing the above description. The scope of the present subject matter should be determined with reference to the appended claims, along with the full scope of equivalents to which such claims are entitled.

The examples that are described in the above description provide sufficient detail to enable those skilled in the art to practice the inventive subject matter, and serve to illustrate how the inventive subject matter may be applied to various purposes or embodiments. References to "an", "one", or "various" embodiments in this disclosure are not necessarily to the same embodiment, and such references may contemplate more than one embodiment. Other embodiments may be utilized, and structural, logical, and electrical changes may be made without departing from the scope of the present disclosure.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A memory, comprising:
   a plurality of memory cells to store data for a page and at least one other page, the page of data being associated with an amount of data to be used for at least one of correcting and detecting error associated with the page of data that is different than an amount of data to be used for at least one of correcting and detecting error associated with the other page of data, wherein the amount of data to be used for at least one of correcting and detecting error associated with the page of data is greater than the amount of data to be used for at least one of correcting and detecting error associated with the other page of data, and the other page includes an amount of memory management data that is different than an amount of memory management data of the page of data.

2. The memory of claim 1, wherein a combination of the amount of data to be used for at least one of correcting and detecting error associated with the page of data and the amount of memory management data that the page includes is equal to a combination of the amount of data to be used for at least one of correcting and detecting error associated with the other page of data and the amount of memory management data that the other page includes.

3. The memory of claim 1, wherein the page of data is free of memory management data.

4. The memory of claim 1, wherein the first page of data include error correction data that consists of at least one of a Reed-Solomon error correction codes, a Bose-Chudry-Hocquehen error correction code, and check sum.

5. A memory, comprising:
   a control circuit; and
   a row of multi-level cells operatively coupled to the control circuit, the multilevel cells to store at least a first page and a second page, the first page being associated with a first error correction code, the second page being associated with a second error correction code that is different than the first error correction code, wherein the first error correction code requires a greater number of bits for error correction than the second error correction code, and the second page includes a greater number of memory management storage bit locations than the first page.

6. The memory of claim 5, wherein the first page and the second page include a same number of memory cells dedicated to data storage.

7. The memory of claim 5, wherein the row of multilevel cells include a fixed number of cells that include an equal number of memory locations for each of the first page and the second page and include an equal number of spare area memory locations for error correction code and block management for each of the first page and the second page.

8. The memory of claim 7, wherein the spare area memory locations of the first page are free from block management data.

9. The memory of claim 5, wherein the first error correction code consists of at least one of a Reed-Solomon error correction codes, a Bose-Chudry-Hocquehen error correction code, and check sum.

10. A non-volatile memory, comprising:
a input/output circuit; and
an array of addressable, multilevel cells operatively coupled to the input/output circuit, the matrix of multi-level cells including a row of multilevel cells to store at least a most significant bit page and a least significant bit page, the most significant bit page including a higher error rate than the least significant bit page, the most significant bit page including a greater number of error correction bits than the least significant bit page, wherein the row of multilevel cells includes a memory storage area and a management area, and wherein cells within the management area include block management data in a least significant bit position.

11. The memory of claim 10, wherein the most significant bits in the cells within the management area include only error correction bits for the most significant bit page.

12. The memory of claim 11, wherein the least significant bits in the cells within the management area include error correction bits for the least significant bit page.

13. The memory of claim 12, wherein the most significant bit page includes data for error correction of both the most significant bit page and the least significant bit page.

14. A memory, comprising:
a input/output circuit;
an array of addressable, multilevel cells operatively coupled to the input/output circuit, the matrix of multi-level cells including a row of multilevel cells to store at least a most significant bit page and a least significant bit page, the most significant bit page including a different error rate than the least significant bit page;
wherein one of the most significant bit page and the least significant bit page including a lower error rate; and
wherein the lower error rate page is to store error correction data for the lower error rate page and the other page.

15. The memory of claim 14, wherein the other page of the most significant bit page and the least significant bit page includes only error correction data for the other page.

16. The memory of claim 15, wherein the one page includes erase block management data for both the most significant bit page and the least significant bit page.

17. The memory of claim 16, wherein the error correction data for the lower error page includes fewer bits than error correction data for the higher error page.

18. The memory of claim 17, wherein the error correction data for the lower error page includes four groups of twelve bytes, and wherein the error correction data for the higher error page includes four groups of greater than twelve bytes.

19. The memory of claim 18, wherein the lower error page includes four sectors.

20. A method of error correction in a memory, comprising:
calculating first error correction data for a first page of a row of multi-level memory cells;
calculating second error correction data for a second page of the row of multi-level memory cells; and
storing data including the first error correction data in a first page and storing the second error correction data in a second page in the row of multi-level memory cells, wherein one of the first page and the second page includes block management data that is larger than block management data associated with the other page.

21. The method of claim 20, wherein calculating the first error correction data includes calculating a first number of error correction bits, and wherein calculating the second error correction data includes calculating a second number of error correction bits different than the first number of bits.

22. The method of claim 21, wherein the first number of bits is equal to a storage size of a spare area.

23. The method of claim 22, wherein storing data includes storing second error correction data and block management data in the second page of the row of multi-level memory cells.

24. The method of claim 20, wherein storing data includes storing first error correction data and block management data in the first page of the row of multi-level memory cells.

25. A memory, comprising:
a control circuit; and
a row of multi-level cells operatively coupled to the control circuit, the multilevel cells to store at least a first page and a second page, the first page being associated with a first error correction code, the second page being associated with a second error correction code that is different than the first error correction code, wherein the row of multilevel cells include a fixed number of cells that include an equal number of memory locations for each of the first page and the second page and include an equal number of spare area memory locations for error correction code and block management for each of the first page and the second page, and the spare area memory locations of the first page are free from block management data.

26. The memory of claim 25, wherein the first error correction code requires a greater number of bits for error correction than the second error correction code.

27. The memory of claim 26, wherein the second page includes a greater number of memory management storage bit locations than the first page.

28. The memory of claim 25, wherein the first page and the second page include a same number of memory cells dedicated to data storage.

* * * * *